United States Patent
Im et al.

(10) Patent No.: US 10,879,286 B2
(45) Date of Patent: Dec. 29, 2020

(54) SEMICONDUCTOR DEVICE INCLUDING FLOATING DIFFUSION AND EXTENSION PATTERN

(71) Applicant: SAMSUNG ELECTRONICS CO., LTD., Suwon-si (KR)

(72) Inventors: Dong Mo Im, Hwaseong-si (KR); Seung Sik Kim, Hwaseong-si (KR); Ji Yoon Kim, Hwaseong-si (KR); Dae Hoon Kim, Hwaseong-si (KR); Min Woong Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/551,898

(22) Filed: Aug. 27, 2019

(65) Prior Publication Data
US 2020/0251512 A1    Aug. 6, 2020

(30) Foreign Application Priority Data
Feb. 1, 2019    (KR) .................. 10-2019-0013666

(51) Int. Cl.
*H01L 27/146* (2006.01)
*H04N 5/351* (2011.01)

(52) U.S. Cl.
CPC .... *H01L 27/14614* (2013.01); *H01L 27/1461* (2013.01); *H01L 27/1463* (2013.01); *H01L 27/14621* (2013.01); *H01L 27/14623* (2013.01); *H01L 27/14627* (2013.01); *H01L 27/14645* (2013.01); *H04N 5/351* (2013.01)

(58) Field of Classification Search
CPC .......... H01L 27/14614; H01L 27/1461; H01L 27/14621; H01L 27/14623; H01L 27/14627; H01L 27/1463; H01L 27/14645; H04N 5/351
USPC ....................................... 348/294
See application file for complete search history.

(56) References Cited

U.S. PATENT DOCUMENTS

| | | | |
|---|---|---|---|
| 9,257,462 B2 | 2/2016 | Park et al. | |
| 9,590,127 B2 | 3/2017 | Roy | |
| 9,929,204 B2* | 3/2018 | Kim ................ | H04N 5/3559 |
| 9,942,503 B2 | 4/2018 | Velichko | |
| 10,103,193 B1 | 10/2018 | Manabe et al. | |
| 10,432,879 B2* | 10/2019 | Chang ............. | H04N 5/37452 |
| 10,510,796 B1* | 12/2019 | Wang ............... | H01L 27/14643 |
| 10,756,129 B2* | 8/2020 | Geurts ............. | H01L 27/14603 |
| 2015/0279899 A1* | 10/2015 | Kim ................ | H01L 27/14614 |
| | | | 250/208.1 |
| 2017/0229503 A1 | 8/2017 | Suzuki et al. | |

(Continued)

*Primary Examiner* — Pritham D Prabhakher
(74) *Attorney, Agent, or Firm* — Lee IP Law, P.C.

(57) ABSTRACT

A semiconductor device and an image sensor, the semiconductor device including a substrate; a photoelectric conversion device in the substrate; a first floating diffusion region adjacent to the photoelectric conversion device; a transfer transistor connected to the photoelectric conversion device and the first floating diffusion region; a reset transistor connected to the first floating diffusion region; a dual conversion gain (DCG) transistor between the first floating diffusion region and the reset transistor; a second floating diffusion region between the DCG transistor and the reset transistor; and an extension pattern, a first portion of the extension pattern being in contact with the second floating diffusion region.

20 Claims, 8 Drawing Sheets

(56) References Cited

U.S. PATENT DOCUMENTS

| | | | |
|---|---|---|---|
| 2018/0070030 A1* | 3/2018 | Geurts | H04N 5/353 |
| 2018/0130839 A1 | 5/2018 | Mauritzson | |
| 2018/0294304 A1 | 10/2018 | Janssens et al. | |
| 2018/0302578 A1* | 10/2018 | Ebihara | H04N 5/37452 |
| 2019/0215471 A1* | 7/2019 | Oh | H01L 27/1464 |
| 2019/0222780 A1* | 7/2019 | Chang | H04N 5/3559 |
| 2019/0260949 A1* | 8/2019 | Geurts | H01L 27/1461 |
| 2019/0386057 A1* | 12/2019 | Wang | H01L 27/14609 |
| 2020/0227454 A1* | 7/2020 | Geurts | H01L 27/14614 |

* cited by examiner

SEMICONDUCTOR DEVICE INCLUDING FLOATING DIFFUSION AND EXTENSION PATTERN

CROSS-REFERENCE TO RELATED APPLICATION

Korean Patent Application No. 10-2019-0013666, filed on Feb. 1, 2019, in the Korean Intellectual Property Office, and entitled: "Semiconductor Device Including Floating Diffusion and Extension Pattern," is incorporated by reference herein in its entirety.

BACKGROUND

1. Field

Embodiments relate to a semiconductor device including a floating diffusion and an extension pattern.

2. Description of Related Art

Image sensors that can operate efficiently in both low illumination and high illumination environments are being studied.

SUMMARY

The embodiments may be realized by providing a semiconductor device including a substrate; a photoelectric conversion device in the substrate; a first floating diffusion region adjacent to the photoelectric conversion device; a transfer transistor connected to the photoelectric conversion device and the first floating diffusion region; a reset transistor connected to the first floating diffusion region; a dual conversion gain (DCG) transistor between the first floating diffusion region and the reset transistor; a second floating diffusion region between the DCG transistor and the reset transistor; and an extension pattern, a first portion of the extension pattern being in contact with the second floating diffusion region.

The embodiments may be realized by providing a semiconductor device including a substrate; a photoelectric conversion device in the substrate; a first floating diffusion region adjacent to the photoelectric conversion device; a first transistor and a second transistor connected to the first floating diffusion region in series; a second floating diffusion region between the first transistor and the second transistor; an extension pattern, a first portion of the extension pattern being in contact with the second floating diffusion region; and an insulating layer covering the extension pattern, wherein a second portion of the extension pattern that is not in contact with the second floating diffusion region is fully covered by the insulating layer.

The embodiments may be realized by providing an image sensor including a substrate; a photoelectric conversion device in the substrate; a first floating diffusion region adjacent to the photoelectric conversion device; a transfer transistor connected to the photoelectric conversion device and the first floating diffusion region; a reset transistor connected to the first floating diffusion region; a dual conversion gain (DCG) transistor between the first floating diffusion region and the reset transistor; an extension pattern in contact with a second floating diffusion region between the DCG transistor and the reset transistor; a first source follower transistor; a pre-charge transistor connected to the first source follower transistor; a sample transistor connected between the first source follower transistor and the pre-charge transistor; a first capacitor having a first electrode and a second electrode facing the first electrode; a second capacitor having a third electrode and a fourth electrode facing the third electrode; a calibration transistor connected to the fourth electrode of the second capacitor; a second source follower transistor; and a selection transistor connected to the second source follower transistor, wherein a first gate electrode of the first source follower transistor is connected to the first floating diffusion region, the third electrode of the second capacitor is connected to the sample transistor and the first electrode of the first capacitor, and a second gate electrode of the second source follower transistor is connected to the calibration transistor and the fourth electrode of the second capacitor.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
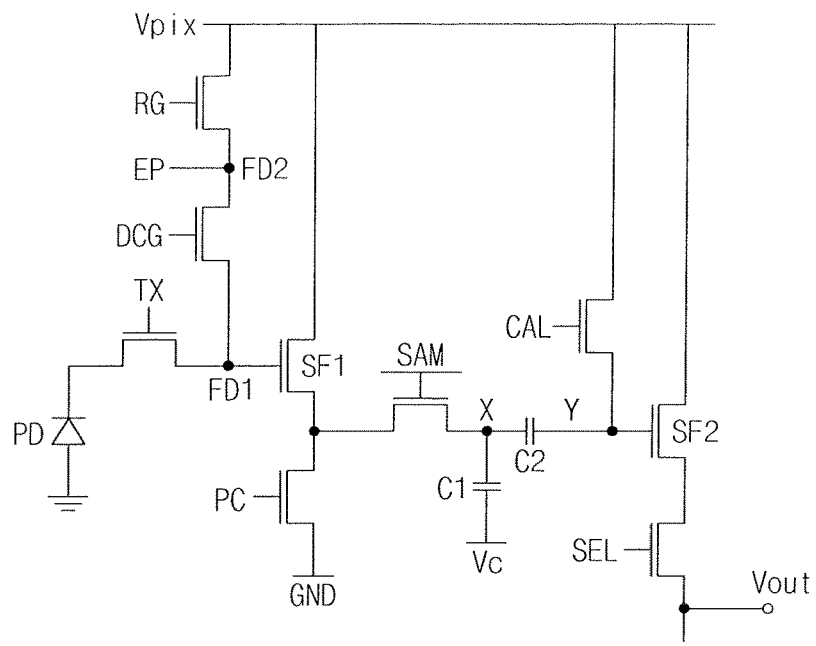
FIG. 1 illustrates a circuit diagram of a semiconductor device according to an example embodiment.
Figure 2:
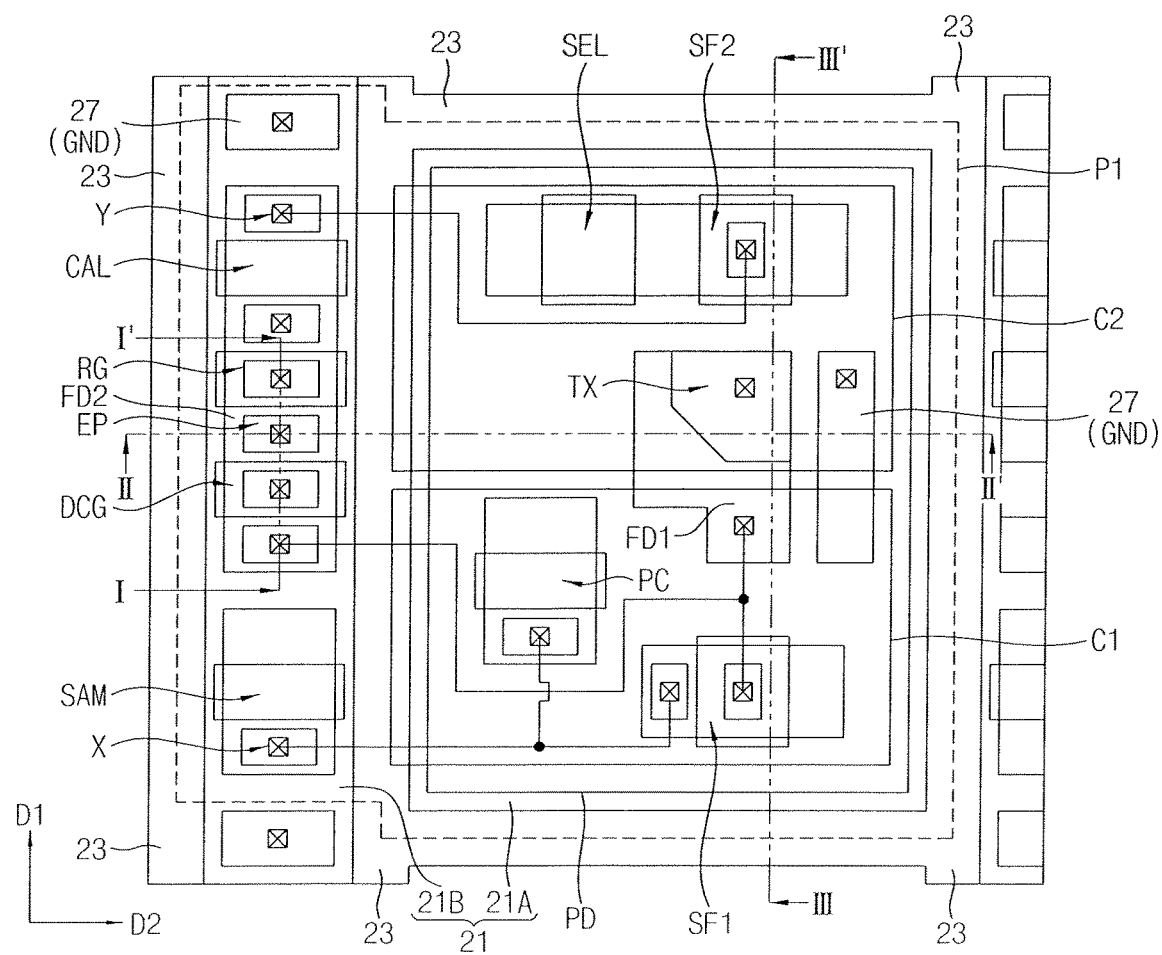
FIG. 2 illustrates a view of the semiconductor device.
Figure 3:
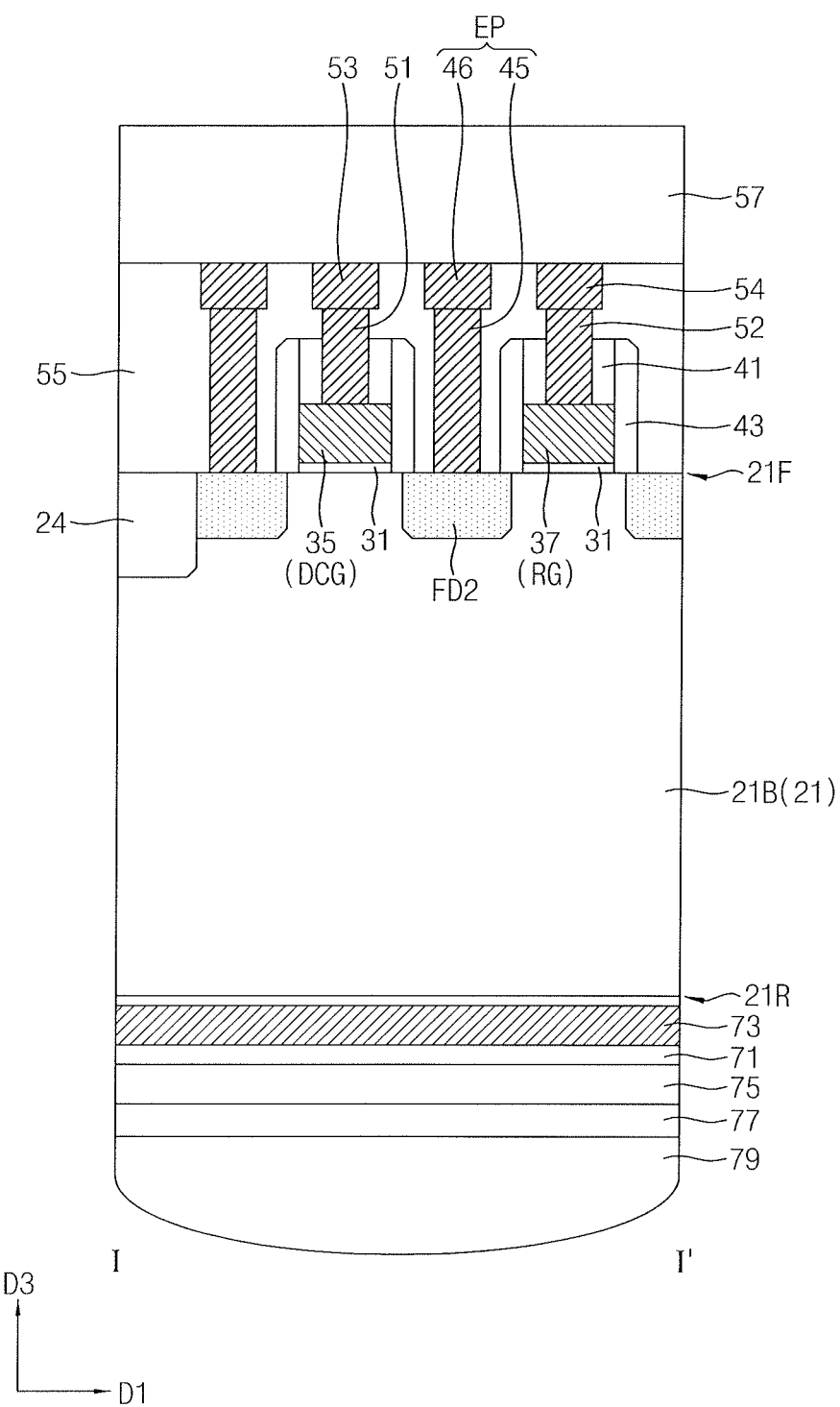
FIG. 3 illustrates a cross-sectional view taken along line I-I' of FIG. 2.
Figure 4:
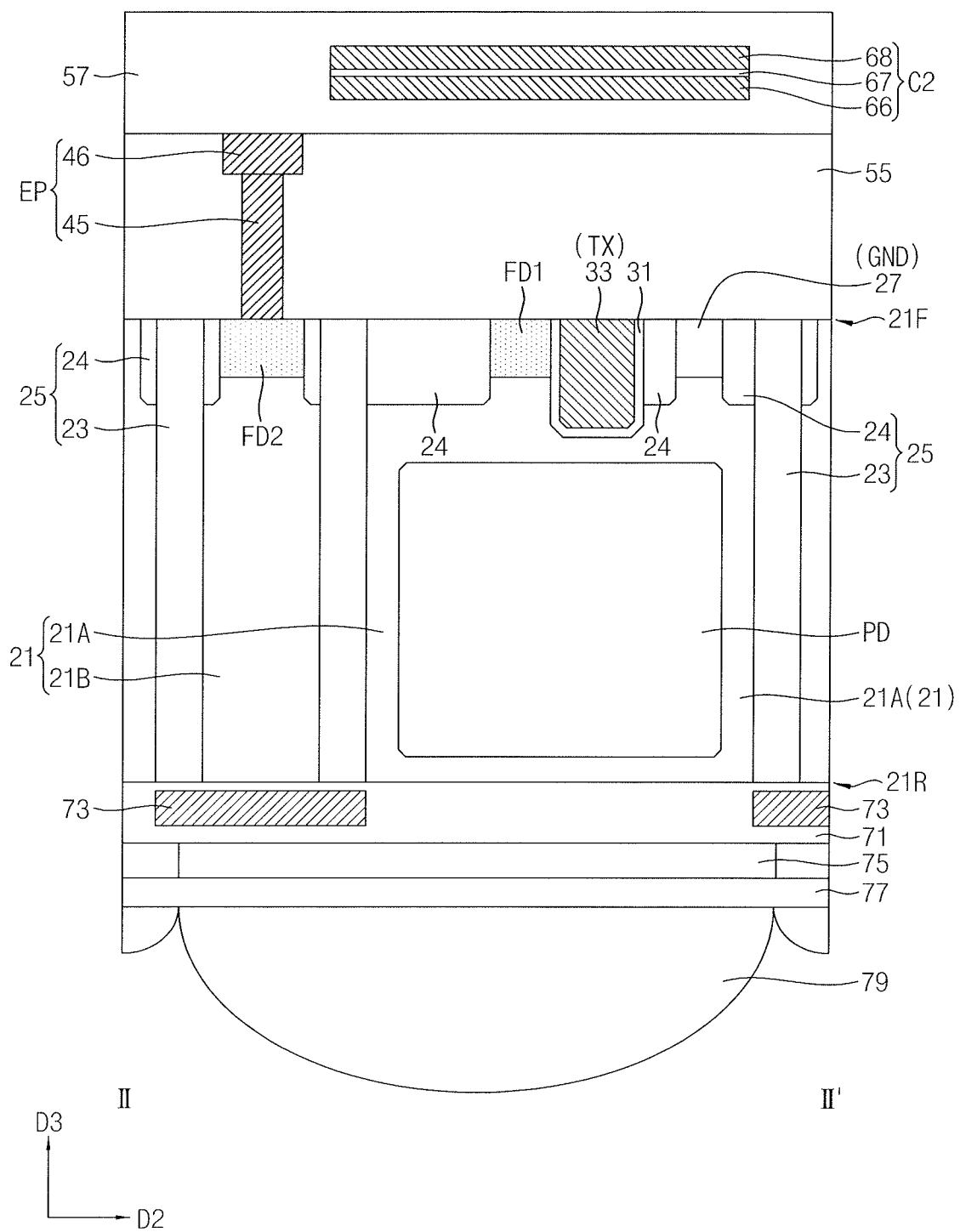
FIG. 4 illustrates a cross-sectional view taken along line II-II' of FIG. 2.
Figure 5:
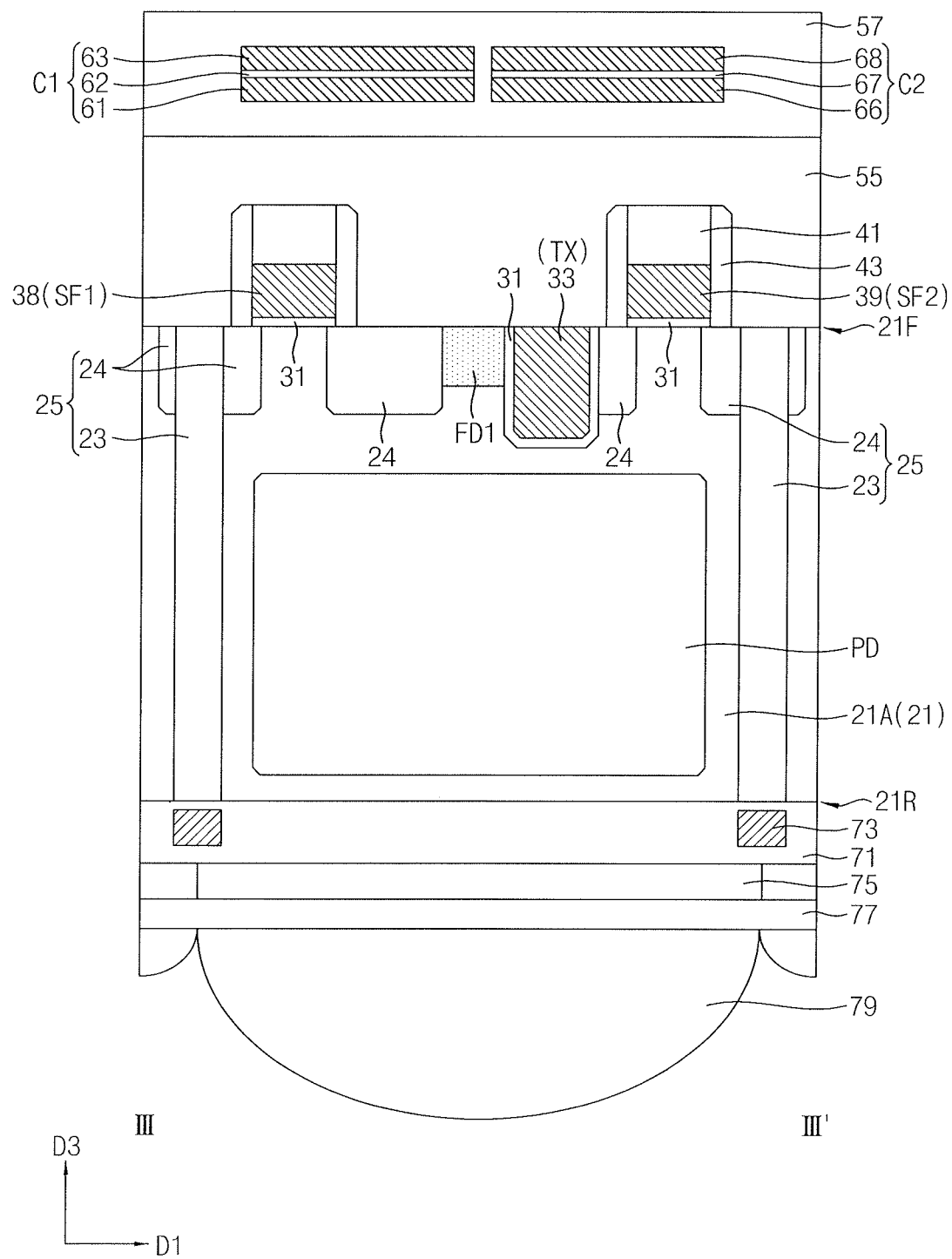
FIG. 5 illustrates a cross-sectional view taken along line III-III' of FIG. 2.

FIG. 1 illustrates a circuit diagram of a semiconductor device according to an example embodiment of, and FIG. 2 illustrates a layout or plan view of the semiconductor device. FIG. 3 illustrates a cross-sectional view taken along line I-I' of FIG. 2, FIG. 4 illustrates a cross-sectional view taken along line II-II' of FIG. 2, and FIG. 5 illustrates a cross-sectional view taken along line of FIG. 2. The semiconductor device according to the example embodiment may include an image sensor such as a back-illuminated image sensor. In an implementation, the semiconductor device according to the example embodiment may include a global shutter image sensor.

Referring to FIG. 1, the semiconductor device according to the example embodiment may include a pixel region of a back-illuminated image sensor. The semiconductor device may include, e.g., a photoelectric conversion device PD, a transfer transistor TX, a first floating diffusion region FD1, a reset transistor RG, a dual conversion gain transistor DCG, a second floating diffusion region FD2, an extension pattern EP, a first source follower transistor SF1, a pre-charge transistor PC, a sample transistor SAM, a first capacitor C1, a second capacitor C2, a calibration transistor CAL, a second source follower transistor SF2, a selection transistor SEL, a first node X, and a second node Y.

Referring to FIG. 2, the semiconductor device according to the example embodiment may include a pixel region P1 of a back-illuminated image sensor. The semiconductor device may include, e.g., a substrate 21, a first device isolation layer 23, a ground region 27, the photoelectric conversion device PD, the transfer transistor TX, the first floating diffusion region FD1, the reset transistor RG, the dual conversion gain transistor DCG, the second floating diffusion region FD2, the extension pattern EP, the first source follower transistor SF1, the pre-charge transistor PC, the sample transistor SAM, the first capacitor C1, the second capacitor C2, the calibration transistor CAL, the second source follower transistor SF2, the selection transistor SEL, the first node X, and the second node Y.

The substrate 21 may include a first region 21A and a second region 21B. The photoelectric conversion device PD, the transfer transistor TX, the first floating diffusion region FD1, the first source follower transistor SF1, the pre-charge transistor PC, the second source follower transistor SF2, and the selection transistor SEL may be in or on the first region 21A. The reset transistor RG, the dual conversion gain transistor DCG, the second floating diffusion region FD2, the extension pattern EP, the sample transistor SAM, and the calibration transistor CAL may be in or on the second region 21B.

Referring to FIG. 3, the semiconductor device may include the second region 21B, a second device isolation layer 24, the second floating diffusion region FD2, a gate dielectric layer 31, a dual conversion gain gate electrode 35 of the dual conversion gain transistor DCG, a reset gate electrode 37 of the reset transistor RG, a gate capping pattern 41, a gate spacer 43, the extension pattern EP, a first gate contact plug 51, a second gate contact plug 52, a first gate pad 53, a second gate pad 54, a first insulating layer 55, a second insulating layer 57, a third insulating layer 71, a light shielding pattern 73, a color filter 75, a fourth insulating layer 77, and a micro lens 79. The second region 21B may include a front surface 21F and a rear surface 21R (opposite to the front surface 21F). The extension pattern EP may include an extension contact plug 45 and an extension pad 46.

Referring to FIG. 4, the semiconductor device may include the substrate 21, a device isolation layer 25, a ground region 27, the photoelectric conversion device PD, the first floating diffusion region FD1, the second floating diffusion region FD2, the gate dielectric layer 31, a transfer gate electrode 33 of the transfer transistor TX, the extension pattern EP, the first insulating layer 55, the second insulating layer 57, the second capacitor C2, the third insulating layer 71, the light shielding pattern 73, the color filter 75, the fourth insulating layer 77, and the micro lens 79. The substrate 21 may include the first region 21A and the second region 21B (adjacent to the first region 21A, e.g., in a second direction D2). The substrate 21 may include the front surface 21F and the rear surface 21R (opposite to the front surface 21F, e.g., in a third direction D3). The device isolation layer 25 may include the first device isolation layer 23 and the second device isolation layer 24. The extension pattern EP may include the extension contact plug 45 and the extension pad 46.

Referring to FIG. 5, the semiconductor device may include the first region 21A, the device isolation layer 25, the photoelectric conversion device PD, the first floating diffusion region FD1, the gate dielectric layer 31, the transfer gate electrode 33 of the transfer transistor TX, a first gate electrode 38 of the first source follower transistor SF1, a second gate electrode 39 of the second source follower transistor SF2, a gate capping pattern 41, a gate spacer 43, the first insulating layer 55, the second insulating layer 57, the first capacitor C1, the second capacitor C2, the third insulating layer 71, the light shielding pattern 73, the color filter 75, the fourth insulating layer 77, and the micro lens 79.

The first capacitor C1 may include a first electrode 61, a second electrode 63 opposite to the first electrode 61, and a first capacitor dielectric layer 62 between the first electrode 61 and the second electrode 63. The second capacitor C2 may include a third electrode 66, a fourth electrode 68 opposite to the third electrode 66, and a second capacitor dielectric layer 67 between the third electrode 66 and the fourth electrode 68.

Referring again to FIGS. 1 to 5, the substrate 21 may include, e.g., a semiconductor substrate such as a single crystalline silicon wafer. In an implementation, the substrate 21 may include, e.g., P-type impurities such as boron (B). Each of the device isolation layer 25, the first insulating layer 55, the second insulating layer 57, the third insulating layer 71, and the fourth insulating layer 77 may independently be a single layer or a multi-layer including different material layers. In an implementation, each of the device isolation layer 25, the first insulating layer 55, the second insulating layer 57, the third insulating layer 71, and the fourth insulating layer 77 may independently include, e.g., a silicon oxide, a silicon nitride, a silicon oxynitride, a low-k dielectric, a high-k dielectric, or a combination thereof.

The device isolation layer 25 may be formed in the substrate 21 using a trench isolation technique. The first device isolation layer 23 may pass through the substrate 21 vertically (e.g., from the front surface 21F to the rear surface 21R in the third direction D3). The first region 21A and the second region 21B may be defined by (e.g., separated by) the first device isolation layer 23. The first device isolation layer 23 may pass between the first region 21A and the second region 21B. The second device isolation layer 24 may be formed adjacent to or at the front surface 21F of the substrate 21.

The ground region 27 may be formed by, e.g., implanting P-type impurities into the substrate 21. The ground region 27 may include a higher concentration of P-type impurities than the substrate 21. The ground region 27 may be adjacent to the front surface 21F of the substrate 21. The ground region 27 may provide a ground GND to the substrate 21. In an implementation, a plurality of ground regions 27 may be in the first region 21A and the second region 21B.

The photoelectric conversion device PD may be formed in the first region 21A. The photoelectric conversion device PD may include, e.g., an N-type impurity region. The photoelectric conversion device PD may be adjacent to the rear surface 21R of the substrate 21 (e.g., may be closer in the third direction D3 to the rear surface 21R of the substrate 21 than to the front surface 21F of the substrate 21).

The transfer transistor TX the first floating diffusion region FD1, the reset transistor RG, the dual conversion gain transistor DCG, the second floating diffusion region FD2, the extension pattern EP, the first source follower transistor SF1, the pre-charge transistor PC, the sample transistor SAM, the first capacitor C1, the second capacitor C2, the calibration transistor CAL, the second source follower transistor SF2, the selection transistor SEL, the first node X, and the second node Y may be formed adjacent to the front surface 21F of the substrate 21.

The first floating diffusion region FD1 may be formed in the first region 21A and adjacent to (e.g., aligned in the third direction D3 with) the photoelectric conversion device PD. The first floating diffusion region FD1 may be formed by, e.g., implanting N-type impurities such as phosphorus (P) or arsenic (As) into the substrate 21. The transfer gate electrode 33 of the transfer transistor TX may be adjacent to the first floating diffusion region FD1. The gate dielectric layer 31 may be between the transfer gate electrode 33 and the first region 21A of the substrate 21 and between the transfer gate electrode 33 and the first floating diffusion region FD1. The transfer transistor TX may be electrically connected to the photoelectric conversion device PD and the first floating diffusion region FD1.

The dual conversion gain gate electrode 35 and the reset gate electrode 37 may be on the front surface 21F of the second region 21B and may be spaced apart from each other (e.g., in a first direction D1). The gate dielectric layer 31 may be between the dual conversion gain gate electrode 35 and the second region 21B and between the reset gate electrode 37 and the second region 21B (e.g., in the third direction).

The second floating diffusion region FD2 may be formed by, e.g., implanting N-type impurities such as phosphorus (P) or arsenic (As) into the substrate 21 between the dual conversion gain gate electrode 35 and the reset gate electrode 37. The second floating diffusion region FD2 may be in the second region 21B. The reset transistor RG and the dual conversion gain transistor DCG may share the second floating diffusion region FD2 with each other. The second floating diffusion region FD2 may be a source or a drain of the reset transistor RG and a source or a drain of the dual conversion gain transistor DCG.

The dual conversion gain transistor DCG may be connected between the first floating diffusion region FD1 and the reset transistor RG. The reset transistor RG may be connected to the first floating diffusion region FD1 via the dual conversion gain transistor DCG. The reset transistor RG and the dual conversion gain transistor DCG may be interpreted as being connected in series to the first floating diffusion region FD1.

The first gate electrode 38 and the second gate electrode 39 may be on the front surface 21F of the first region 21A of the substrate 21 and may be spaced apart from each other (e.g., in the first direction DD. The gate dielectric layer 31 may be between the first gate electrode 38 and the first region 21A and between the second gate electrode 39 and the first region 21A (e.g., in the third direction D3). The gate capping pattern 41 may be on the dual conversion gain gate electrode 35, the reset gate electrode 37, the first gate electrode 38, and the second gate electrode 39. The gate spacer 43 may be on side surfaces of the dual conversion gain gate electrode 35, the reset gate electrode 37, the first gate electrode 38, the second gate electrode 39, and the gate capping pattern 41.

The gate dielectric layer 31 may include, e.g., a silicon oxide, a silicon nitride, a silicon oxynitride, a high-k dielectric, or a combination thereof. Each of the transfer gate electrode 33, the dual conversion gain gate electrode 35, the reset gate electrode 37, the first gate electrode 38, and the second gate electrode 39 may independently include, e.g., a metal, a metal silicide, a metal nitride, a metal oxide, a polysilicon, a conductive carbon, or a combination thereof. Each of the gate capping pattern 41 and the gate spacer 43 may independently include, e.g., a silicon oxide, a silicon nitride, a silicon oxynitride, a low-k dielectric, a high-k dielectric, or a combination thereof.

The first insulating layer 55 may cover the front surface 21F of the substrate 21. The extension pattern EP, the first gate contact plug 51, the second gate contact plug 52, the first gate pad 53, and the second gate pad 54 may be in the first insulating layer 55. Each of the extension pattern EP, the first gate contact plug 51, the second gate contact plug 52, the first gate pad 53, and the second gate pad 54 may independently include, e.g., a metal, a metal silicide, a metal nitride, a metal oxide, a polysilicon, a conductive carbon, or a combination thereof.

The extension contact plug 45 may be between the dual conversion gain gate electrode 35 and the reset gate electrode 37 (e.g., in the first direction D1) and may be in direct contact with the second floating diffusion region FD2. The extension contact plug 45 may pass or extend through the first insulating layer 55 (e.g., in the third direction D3).

The first gate contact plug 51 may be on the dual conversion gain gate electrode 35 and may pass or extend through the first insulating layer 55 and the gate capping pattern 41 (e.g., in the third direction D3). The second gate contact plug 52 may be on the reset gate electrode 37 and may pass or extend through the first insulating layer 55 and the gate capping pattern 41 (e.g., in the third direction D3). The extension contact plug 45 may be adjacent to the dual conversion gain gate electrode 35, the reset gate electrode 37, the first gate contact plug 51, and the second gate contact plug 52. Upper surfaces (e.g., surfaces facing away from the substrate 21) of the extension contact plug 45, the first gate contact plug 51, and the second gate contact plug 52 may be substantially coplanar.

The extension pad 46 may be formed on the extension contact plug 45. The first gate pad 53 may be formed on the first gate contact plug 51. The second gate pad 54 may be formed on the second gate contact plug 52. The extension pad 46 may be adjacent to the first gate pad 53 and the second gate pad 54. The extension pad 46 may be between the first gate pad 53 and the second gate pad 54 (e.g., in the first direction DD. Upper surfaces of the extension pad 46, the first gate pad 53, and the second gate pad 54 may be substantially coplanar.

The second insulating layer 57 may be formed on the first insulating layer 55. The first capacitor C1 and the second capacitor C2 may be in the second insulating layer Each of the first electrode 61, the second electrode 63, the third electrode 66, and the fourth electrode 68 may independently include, e.g., a metal, a metal silicide, a metal nitride, a metal oxide, a polysilicon, a conductive carbon, or a combination thereof. Each of the first capacitor dielectric layer 62 and the second capacitor dielectric layer 67 may independently include, e.g., a silicon oxide, a silicon nitride, a silicon oxynitride, a high-k dielectric, or a combination thereof. In an implementation, each of the first capacitor C1 and the second capacitor C2 may independently include, e.g., various types of three-dimensional capacitors such as a cylinder type capacitor, a pillar type capacitor, a box type capacitor, and a combination thereof. Each of the first capacitor C1 and the second capacitor C2 may independently include, e.g., a capacitor array in which a plurality of capacitors are connected in parallel and/or in series.

A first portion of the extension pattern EP may be in direct contact with the second floating diffusion region FD2 (between the dual conversion gain transistor DCG and the reset transistor RG). A remaining or second portion of the extension pattern EP (e.g., a portion of the extension pattern EP not in contact with the second floating diffusion region FD2) may be fully covered by the first insulating layer 55 and the second insulating layer 57. The second portion of the extension pattern EP (e.g., excluding the contact surface between the extension pattern EP and the second floating diffusion region FD2) may not be in contact with a conductive interconnection.

The pre-charge transistor PC may be connected to the first source follower transistor SF1. The sample transistor SAM may be connected between the first source follower transistor SF1 and the pre-charge transistor PC. The calibration transistor CAL may be connected to the fourth electrode 68 of the second capacitor C2. The selection transistor SEL may be connected to the second source follower transistor SF2. The first gate electrode 38 of the first source follower transistor SF1 may be connected to the first floating diffusion region FD1. The third electrode 66 of the second capacitor C2 may be connected to the sample transistor SAM and the first electrode 61 of the first capacitor C1. The second gate electrode 39 of the second source follower transistor SF2 may be connected to the calibration transistor CAL and the fourth electrode 68 of the second capacitor C2.

One end of each of the reset transistor RG, the first source follower transistor SF1, the second source follower transistor SF2, and the calibration transistor CAL may be connected to a first power source Vpix. One end of the pre-charge transistor PC may be connected to the ground GND. The second electrode 63 of the first capacitor C1 may be connected to a second power source Vc. One end of the selection transistor SEL may be connected to an output line Vout. One end of the sample transistor SAM may be connected to the first electrode 61 of the first capacitor C1 and the third electrode 66 of the second capacitor C2 to constitute the first node X. One end of the calibration transistor CAL may be connected to the fourth electrode 68 of the second capacitor C2 and the second gate electrode 39 of the second source follower transistor SF2 to constitute the second node Y.

The third insulating layer 71 may be formed on the rear surface 21R of the substrate 21. The light shielding pattern 73 may be in the third insulating layer 71. The light shielding pattern 73 may include a light shielding material, e.g., a metal. The light shielding pattern 73 may fully cover (e.g., may be congruently aligned with) the rear surface 21R of the second region 21B. The light shielding pattern 73 may overlap the first device isolation layer 23. The color filter 75 may be on the third insulating layer 71. The fourth insulating layer 77 may be formed on the color filter 75. The micro lens 79 may be on the fourth insulating layer 77.

Figure 6:
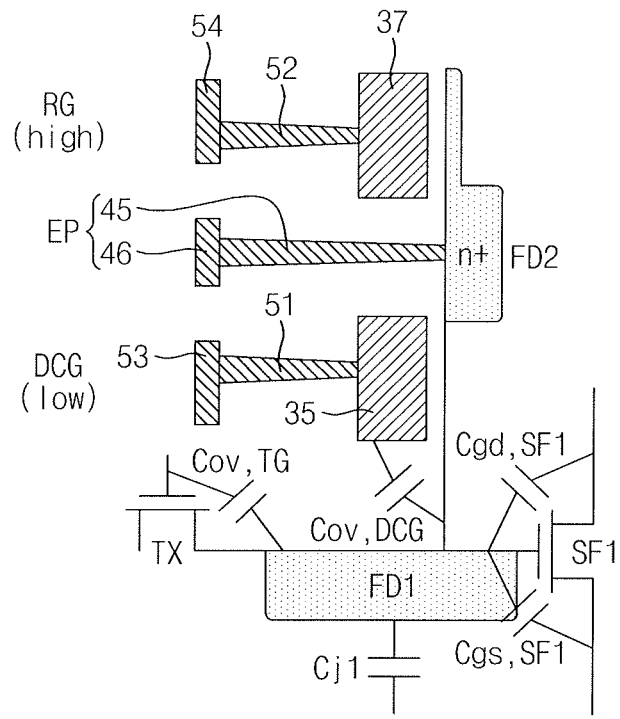
FIGS. 6 and 7 illustrate schematic diagrams of an operation of a semiconductor device.
Figure 7:
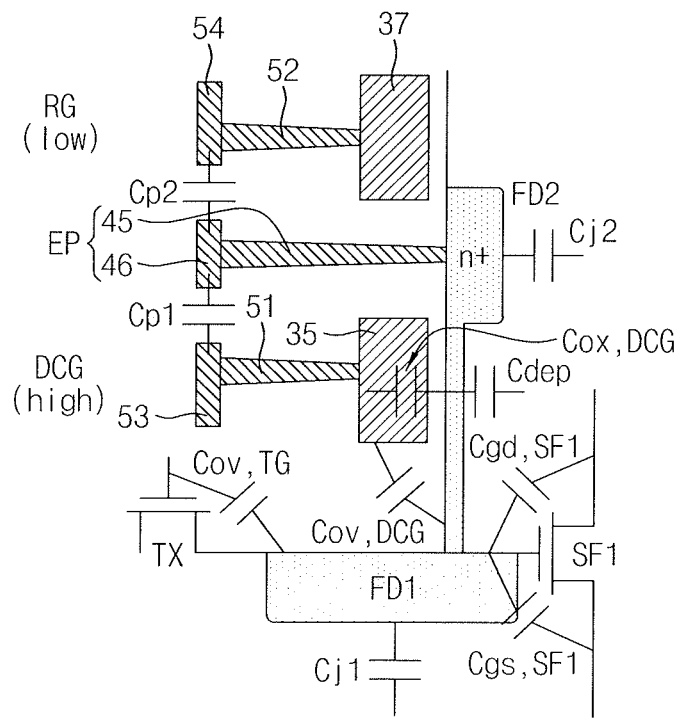

FIGS. 6 and 7 illustrate schematic diagrams of an operation of a semiconductor device. Semiconductor devices according to example embodiments may operate in a high conversion gain (HCG) mode in a low illuminance environment, as shown in FIG. 6 and may operate in a low conversion gain (LCG) mode in a high illuminance environment, as shown in FIG. 7.

Referring to FIG. 6, in order to operate the semiconductor device in an HCG mode in a low illuminance environment, the reset transistor RG may be turned on (high), and the dual conversion gain transistor DCG may be turned off (low). In the HCG mode, a capacitance model of the floating diffusion may be interpreted as including a sum of a first capacitance (Cov, TG), a second capacitance (Cj1), a third capacitance (Cgs, SF1), a fourth capacitance (Cgd, SF1), and a fifth capacitance (Cov, DCG). In the low illuminance environment, the HCG mode may be used so that random noise may be minimized.

Referring to FIG. 7, in order to operate the semiconductor device in an LCG mode in a high illuminance environment, the reset transistor RG may be turned off (low), and the dual conversion gain transistor DCG may be turned on (high). In the LCG mode, a capacitance model of the floating diffusion may be interpreted as including a sum of a first capacitance (Cov, TG), the second capacitance (Cj1), a third capacitance (Cgs, SF1), a fourth capacitance (Cgd, SF1), a fifth capacitance (Cov, DCG), a sixth capacitance (Cox, DCG), a seventh capacitance (Cdep), an eighth capacitance (Cj2), a ninth capacitance (Cp1), and a tenth capacitance (Cp2). In the LCG mode, the capacitance of the floating diffusion may be increased due to the extension pattern EP. In the high illuminance environment, the LCG mode may be used so that conversion gain may be efficiently lowered.

Figure 8:
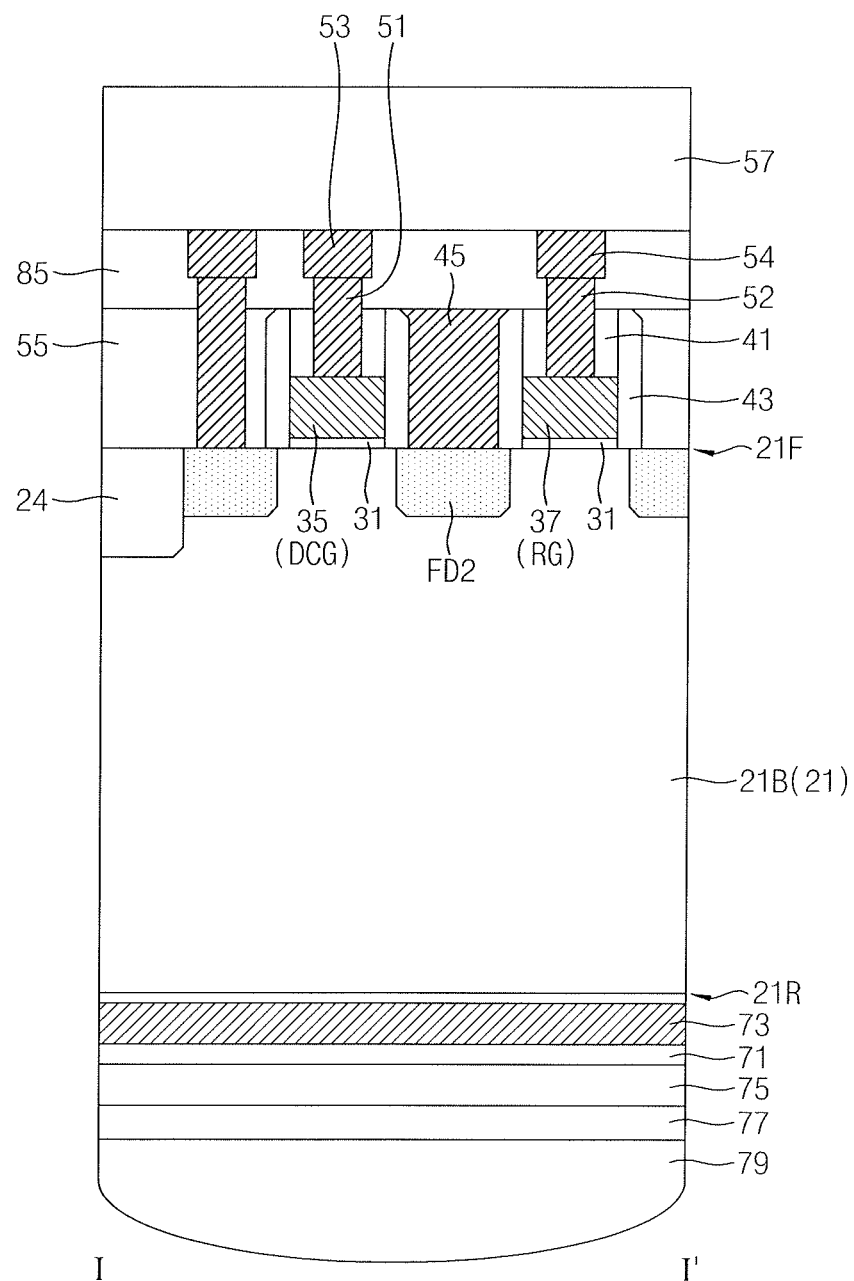
FIGS. 8 and 9 illustrate cross-sectional views of semiconductor devices according to example embodiments.
Figure 9:
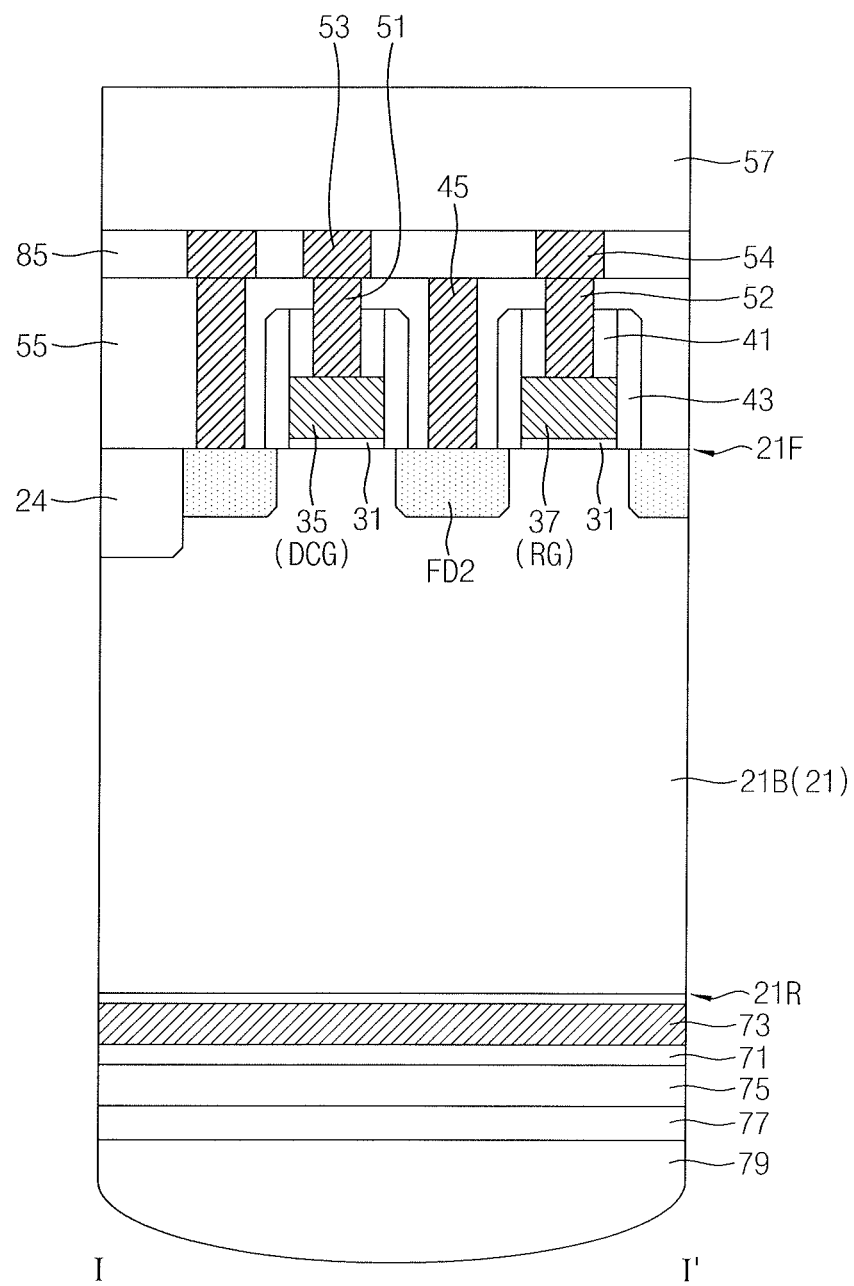

FIGS. 8 and 9 illustrate cross-sectional views of describing semiconductor devices according to example embodiments.

Referring to FIG. 8, a fifth insulating layer 85 may be formed between a first insulating layer 55 and a second insulating layer 57 (e.g., in the third direction D3). An extension contact plug 45 may be self-aligned between gate spacers 43 (e.g., in the first direction D1). Upper surfaces of a gate capping pattern 41, the gate spacers 43, the extension contact plug 45, and the first insulating layer 55 may be substantially coplanar. Upper ends of a first gate contact plug 51 and a second gate contact plug 52 may be in the fifth insulating layer 85. The upper surface of the extension contact plug 45 may be formed at a lower level (e.g., closer to the substrate 21 in the third direction D3) than the upper ends of the first gate contact plug 51 and the second gate contact plug 52.

Referring to FIG. 9, a fifth insulating layer 85 may be formed between a first insulating layer 55 and a second insulating layer 57 (e.g., in the third direction D3). Upper surfaces of an extension contact plug 45, a first gate contact plug 51, a second gate contact plug 52, and the first insulating layer 55 may be substantially coplanar. A first gate pad 53 and a second gate pad 54 may be formed in the fifth insulating layer 85.

Figure 10:
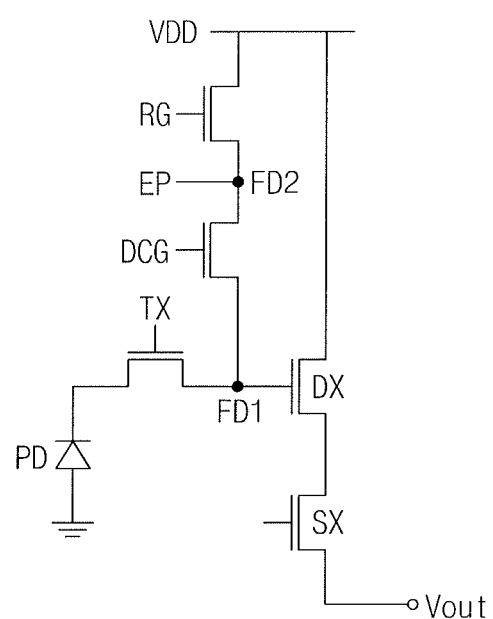
FIG. 10 illustrates a circuit diagram of a semiconductor device according to an example embodiment.

FIG. 10 illustrates a circuit diagram of a semiconductor device according to an example embodiment.

Referring to FIG. 10, the semiconductor device according to the example embodiments may include, e.g., a photoelectric conversion device PD, a transfer transistor TX, a first floating diffusion region FD1, a reset transistor RG, a dual conversion gain transistor DCG, a second floating diffusion region FD2, an extension pattern EP, a drive transistor DX, and a selection transistor SX.

A drain voltage VDD may be applied to one end of each of the reset transistor RG and the drive transistor DX. A gate electrode of the drive transistor DX may be connected to the first floating diffusion region FD1. The selection transistor SX may be connected to the drive transistor DX. One end of the selection transistor SX may be connected to an output line Vout. The output line Vout may correspond to a column line.

By way of summation and review, a pixel region of an image sensor may include a photodiode and a floating diffusion. An image signal sensed in the photodiode may be output via the floating diffusion. Selectively increasing the capacitance of the floating diffusion may be advantageous for efficient operation of the image sensor.

According to the example embodiments, an extension pattern in contact (e.g., direct contact) with a second floating diffusion region (between a dual conversion gain transistor and a reset transistor (may be provided. In an LCG mode, the capacitance of a floating diffusion may be be increased due to the extension pattern. In a high illuminance environment, the LCG mode can be used so that conversion gain may be efficiently lowered. In a low illuminance environment, the HCG mode may be used so that random noise can be minimized. An image sensor that can operate efficiently in both low illumination and high illumination environments may be implemented.

One or more embodiments may provide an image sensor that can operate efficiently in both low illumination and high illumination environments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   a photoelectric conversion device in the substrate;
   a first floating diffusion region adjacent to the photoelectric conversion device;
   a transfer transistor connected to the photoelectric conversion device and the first floating diffusion region;
   a reset transistor connected to the first floating diffusion region;
   a dual conversion gain (DCG) transistor between the first floating diffusion region and the reset transistor;
   a second floating diffusion region between the DCG transistor and the reset transistor; and
   an extension pattern, a first portion of the extension pattern being in contact with the second floating diffusion region.

2. The semiconductor device of claim 1, further comprising an insulating layer covering the extension pattern,
   wherein a second portion of the extension pattern that is not in contact with the second floating diffusion region is fully covered by the insulating layer.

3. The semiconductor device of claim 1, wherein:
   the DCG transistor includes a DCG gate electrode; and
   the extension pattern includes an extension contact plug adjacent to the DCG gate electrode.

4. The semiconductor device of claim 3, further comprising a first gate contact plug on the DCG gate electrode and adjacent to the extension contact plug.

5. The semiconductor device of claim 4, wherein upper surfaces of the extension contact plug and the first gate contact plug are substantially coplanar.

6. The semiconductor device of claim 4, further comprising a first gate pad on the first gate contact plug,
   wherein the extension pattern further includes an extension pad on the extension contact plug and adjacent to the first gate pad.

7. The semiconductor device of claim 1, wherein:
   the reset transistor includes a reset gate electrode; and
   the extension pattern includes an extension contact plug adjacent to the reset gate electrode.

8. The semiconductor device of claim 7, further comprising a second gate contact plug on the reset gate electrode and adjacent to the extension contact plug.

9. The semiconductor device of claim 8, wherein upper surfaces of the extension contact plug and the second gate contact plug are substantially coplanar.

10. The semiconductor device of claim 8, further comprising a second gate pad on the second gate contact plug, wherein the extension pattern further includes an extension pad on the extension contact plug and adjacent to the second gate pad.

11. The semiconductor device of claim 1, wherein:
    the DCG transistor includes a DCG gate electrode,
    the reset transistor includes a reset gate electrode,
    the extension pattern includes an extension contact plug between the DCG gate electrode and the reset gate electrode, and
    the semiconductor device further includes:
       a first gate contact plug on the DCG gate electrode;
       a first gate pad on the first gate contact plug;
       a second gate contact plug on the reset gate electrode; and
       a second gate pad on the second gate contact plug.

12. The semiconductor device of claim 11, wherein upper surfaces of the extension contact plug, the first gate contact plug, and the second gate contact plug are substantially coplanar.

13. The semiconductor device of claim 11, wherein:
    the extension pattern further includes an extension pad on the extension contact plug and between the first gate pad and the second gate pad,
    the extension pad is in contact with the extension contact plug, and
    upper surfaces of the first gate pad, the second gate pad, and the extension pad are substantially coplanar.

14. The semiconductor device of claim 1, wherein:
    the substrate further includes a device isolation layer defining a first region and a second region thereof,
    the photoelectric conversion device is in the first region, and
    the second floating diffusion region is in the second region.

15. The semiconductor device of claim 14, wherein the DCG transistor and the reset transistor are on the second region.

16. The semiconductor device of claim 15, wherein the device isolation layer passes between the first region and the second region.

17. The semiconductor device of claim 15, further comprising:
    a light shielding pattern on a rear surface of the substrate;
    a color filter on the rear surface of the substrate; and
    a micro lens on the color filter,
    wherein:
       the second floating diffusion region is adjacent to a front surface of the substrate, which is opposite the rear surface of the substrate, and
       the light shielding pattern covers the rear surface of the substrate in the second region.

18. The semiconductor device of claim 1, wherein the extension pattern includes a metal, a metal silicide, a metal nitride, a metal oxide, a polysilicon, a conductive carbon, or a combination thereof.

19. A semiconductor device, comprising:
    a substrate;
    a photoelectric conversion device in the substrate;
    a first floating diffusion region adjacent to the photoelectric conversion device;
    a first transistor and a second transistor connected to the first floating diffusion region in series;
    a second floating diffusion region between the first transistor and the second transistor;
    an extension pattern, a first portion of the extension pattern being in contact with the second floating diffusion region; and an insulating layer covering the extension pattern,
wherein a second portion of the extension pattern that is not in contact with the second floating diffusion region is fully covered by the insulating layer.

20. An image sensor, comprising:
a substrate;
a photoelectric conversion device in the substrate;
a first floating diffusion region adjacent to the photoelectric conversion device;
a transfer transistor connected to the photoelectric conversion device and the first floating diffusion region;
a reset transistor connected to the first floating diffusion region;
a dual conversion gain (DCG) transistor between the first floating diffusion region and the reset transistor;
an extension pattern in contact with a second floating diffusion region between the DCG transistor and the reset transistor;
a first source follower transistor;
a pre-charge transistor connected to the first source follower transistor;
a sample transistor connected between the first source follower transistor and the pre-charge transistor;
a first capacitor having a first electrode and a second electrode facing the first electrode;
a second capacitor having a third electrode and a fourth electrode facing the third electrode;
a calibration transistor connected to the fourth electrode of the second capacitor;
a second source follower transistor; and
a selection transistor connected to the second source follower transistor,
wherein:
a first gate electrode of the first source follower transistor is connected to the first floating diffusion region,
the third electrode of the second capacitor is connected to the sample transistor and the first electrode of the first capacitor, and
a second gate electrode of the second source follower transistor is connected to the calibration transistor and the fourth electrode of the second capacitor.

* * * * *